(12) United States Patent
Brennecka et al.

(10) Patent No.: US 10,431,280 B1
(45) Date of Patent: Oct. 1, 2019

(54) FERROELECTRIC OPENING SWITCH

(71) Applicant: Sandia Corporation, Albuquerque, NM (US)

(72) Inventors: Geoffrey L. Brennecka, Lakewood, CO (US); Steven F. Glover, Albuquerque, NM (US); Gary Pena, Albuquerque, NM (US); Fred J. Zutavern, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 829 days.

(21) Appl. No.: 15/137,539

(22) Filed: Apr. 25, 2016

Related U.S. Application Data

(60) Provisional application No. 62/159,016, filed on May 8, 2015.

(51) Int. Cl.
*G11C 11/22* (2006.01)

(52) U.S. Cl.
CPC .................................. *G11C 11/22* (2013.01)

(58) Field of Classification Search
CPC ... G11C 11/22; G11C 11/2275; G11C 11/221; G11C 11/2257; G11C 11/2259
USPC ............... 365/49.13, 65, 109, 117, 145, 148
See application file for complete search history.

(56) References Cited

U.S. PATENT DOCUMENTS

| | | | | |
|---|---|---|---|---|
| 6,080,235 | A | * | 6/2000 | McKee .................. C30B 33/04 117/2 |
| 2006/0121203 | A1 | * | 6/2006 | Kimura ................ B01J 19/0013 427/402 |
| 2010/0085863 | A1 | * | 4/2010 | Franklin .................. G11B 9/02 369/126 |

OTHER PUBLICATIONS

Brennecka, G.L. et al., "Simulation Studies of Nucleation of Ferroelectric Polarization Reversal", Sandia National Laboratories Report, SAND2014-16529, Aug. 2014.

(Continued)

*Primary Examiner* — Harry W Byrne
(74) *Attorney, Agent, or Firm* — Kevin W. Bieg

(57) ABSTRACT

A ferroelectric opening switch is enabled by controlled polarization switching via nucleation in a ferroelectric material, such as $BaTiO_3$, $Pb(Zr,Ti)O_3$, $LiNbO_3$, $LiTaO_3$, or variants thereof. For example, nucleation sites can be provided by mechanical seeding, grain boundaries, or optical illumination. The invention can be used as an opening switch in large scale pulsed-power systems. However, the switch can also be used in compact pulsed-power systems (e.g., as drivers for high power microwave systems), as passive fault limiters for high voltage dc (HVDC) systems, and/or in other high power applications.

13 Claims, 8 Drawing Sheets

(56) References Cited

OTHER PUBLICATIONS

Meier, W. et al., "Highly Textured BaTiO3 via Templated Grain Growth and Resulting Polarization Reversal Dynamics", J. Am. Ceram. Soc. 99(3), 922 (2016).

Reed, K. et al., "Ferroelectric Opening Switches for Large-Scale Pulsed Power Drivers", SAND2009-7527 (2009).

Rim, G.H. et al., "Fast High Voltage Pulse Generation Using Nonlinear Capacitors", IEEE International Pulsed Conference, 1460-1463 (1999).

Rim, G.H. et al., "Nanosecond Pulse Generation with Nonlinear Capacitors and Magnetic Power Compression", IEEE International Pulsed Power Conference (2002).

Zutavern, F.J. et al., "A Testbed for High Voltage, High Bandwidth Characterization of Nonlinear Dielectrics", Proc. 19th IEEE Pulsed Power Conference (2013).

\* cited by examiner

FIG. 1D
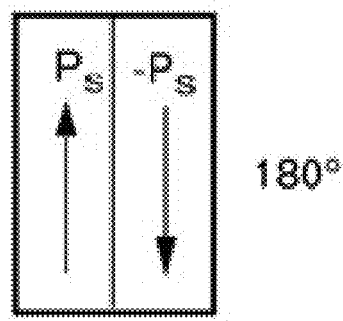
FIG. 1E
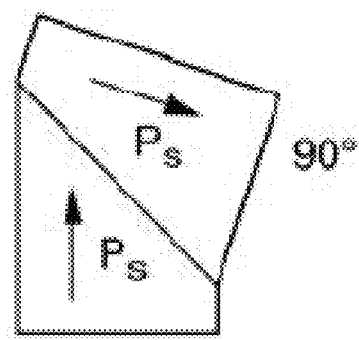
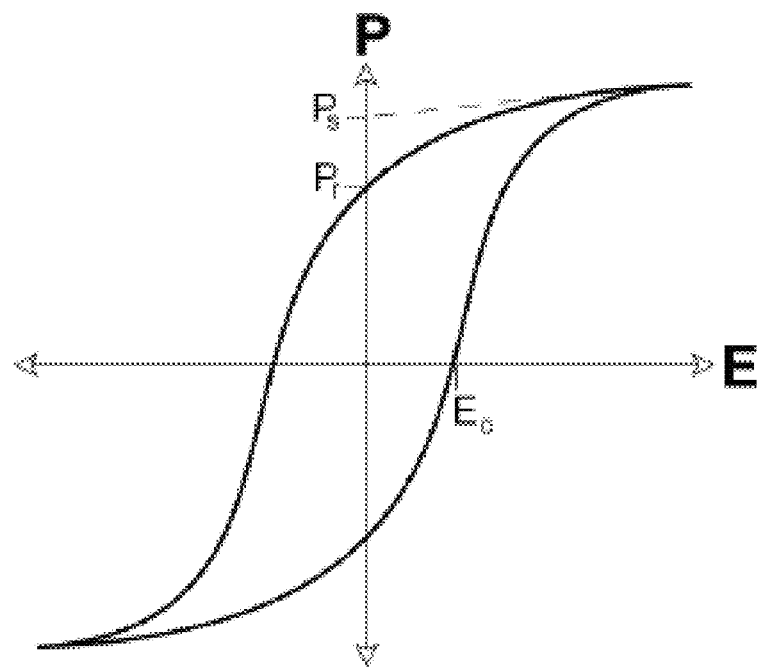
FIG. 1F

Pristine wafer

10x10 matrix on each side of wafer 988 indents, ~660μm spacing, one side

US 10,431,280 B1

FERROELECTRIC OPENING SWITCH

CROSS-REFERENCE TO RELATED APPLICATION

This application also claims the benefit of U.S. Provisional Application No. 62/159,016, filed May 8, 2015, which is incorporated herein by reference.

STATEMENT OF GOVERNMENT INTEREST

This invention was made with Government support under contract no. DE-AC04-94AL85000 awarded by the U. S. Department of Energy to Sandia Corporation. The Government has certain rights in the invention.

FIELD OF THE INVENTION

The present invention relates to opening switch technology and, in particular, to a ferroelectric opening switch that uses nucleation to control polarization switching in a ferroelectric material.

BACKGROUND OF THE INVENTION

Essentially all large scale pulsed-power systems are based upon capacitive energy storage in which closing switches initiate discharge through low impedance loads. Such systems are inherently inefficient because of 1) the impedance mismatch between capacitive storage and inductive loads, 2) the pulse forming steps required to achieve the desired pulse compression for fast rise-time, short-duration pulses, 3) the low energy density of available electrostatic capacitors, and 4) the enormous investment (in terms of volume, cost, and maintenance) associated with physically large high-voltage systems. Systems based on inductive energy storage would offer tremendous advantages in these areas because of 1) better impedance matching would immediately lead to ~5-10× improved efficiency in energy delivery to inductive loads, 2) achieving ns or faster rise times in a single stage would eliminate the need for pulse compression architecture and associated losses, 3) inductive energy storage offers ~1000× higher achievable energy densities than capacitive energy storage, and 4) with an effective opening switch, high voltages are only present briefly during switching and only at the switch and load rather than across the entire system for the entirety of operation. Inductive energy storage and associated systems, however, require opening switches (an opening switch interrupts the flow of current whereas a closing switch enables current to flow), and the only presently available high power opening switches are single use and/or unreliable and therefore inappropriate for implementation in a large-scale inductive energy storage system.

Therefore, a need exists for a reliable, multi-use high power solid-state opening switch.

SUMMARY OF THE INVENTION

The present invention is directed to a ferroelectric opening switch enabled by controlled polarization switching via nucleation in a ferroelectric material. The ferroelectric material can a single crystal or a polycrystalline ceramic, such as $BaTiO_3$, $Pb(Zr,Ti)O_3$, $LiNbO_3$, $LiTaO_3$, or variants thereof. The nucleation sites can be provided by texturing the surface of the ferroelectric material, such as with mechanical indents, or by the grain boundaries of the polycrystalline ceramic itself. Alternatively, light having energies greater than the band gap can be used to illuminate the near-surface region of the material, providing an optical equivalent to the mechanical seeding approach. Alternatively, internal nucleation sites can provided by establishing a birefringence laser pattern within an optically transparent ferroelectric material.

The invention can be used as an opening switch in large scale pulsed-power systems. However, the switch can also be used in compact pulsed-power systems (e.g., as drivers for high power microwave systems), as passive fault limiters for high voltage dc (HVDC) systems, and/or in other high power applications.

BRIEF DESCRIPTION OF THE DRAWINGS

The detailed description will refer to the following drawings, wherein like elements are referred to by like numbers.

FIGS. 1D and 1E illustrate macroscopic polarization directions associated with domain walls. FIG. 1F is a plot of a characteristic ferroelectric hysteresis loop with spontaneous polarization ($P_s$), remanent polarization ($P_r$), and coercive field ($E_c$) labeled.

DETAILED DESCRIPTION OF THE INVENTION

Prior work has demonstrated the promise of an opening switch based upon the polarization reversal of a ferroelectric material, i.e., a ferroelectric opening switch (FEOS), but has revealed limitations associated with reliable and repeatable control of material performance. The present invention provides a method for controlling the dynamic material response to make FEOS technology feasible.

Figures 1A, 1B, 1C:
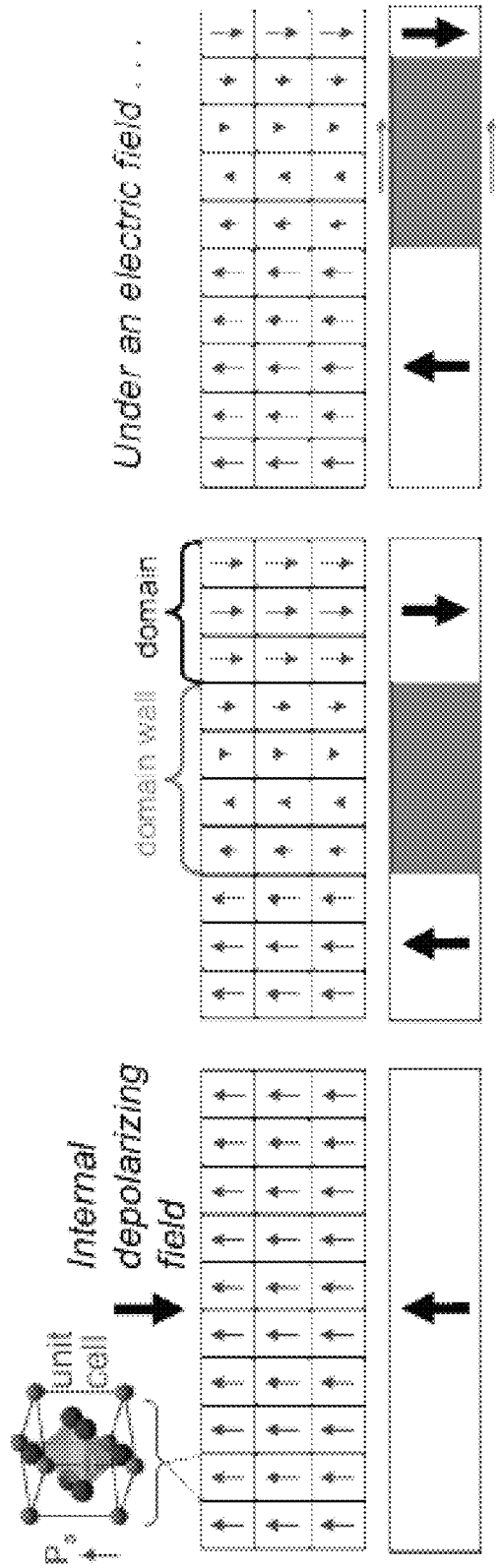
FIG. 1A illustrates an assemblage of individual unit cells of similarly aligned spontaneous polarization which form a single domain.
FIG. 1B illustrates graded polarization across a 180° domain wall.
FIG. 1C illustrates motion of a 180° domain wall under an applied electric field.

Certain classes of dielectric materials possess permanent electrical dipoles ($P_s$) even in the absence of an externally applied electric field. In crystalline ceramics, the possible orientations of these permanent dipoles are limited to distinct and thermodynamically equivalent directions as determined by the symmetry of the crystal. Under application of an external electric field, these permanent dipoles can be made to switch from one orientation to another, resulting in polarization switching, as shown in FIGS. 1A-C. Contiguous groups of unit cells whose permanent dipoles share the same polarization orientation are called domains. A single domain is shown in FIG. 1A. Domains can move and change shape via domain wall motion. The interface between two non-similar domains is known as a "domain wall" and it moves when the polarization of crystal cells within it change orientation, as shown in FIGS. 1B and 1C. Since ferroelectricity is a phonon-mediated phenomenon, domain wall motion cannot achieve a velocity greater than the acoustic velocity in any given material. Under practical electric fields, achievable domain wall velocities are often significantly less than the acoustic velocity. This domain behavior is most simply demonstrated when there are only two possible orientation directions, oriented anti-parallel to one another (shown in FIG. 1D), but is also valid for the 90° domain walls in tetragonal and orthorhombic ferroelectrics (as shown in FIG. 1E), 71° and 109° domain walls in rhombohedral ferroelectrics, and other walls in lower symmetry systems. While 180° domain walls involve only electrostatic interactions, non-180° domains also involve mechanical strain; such walls are thus both ferroelectric and ferroelastic.

As shown in FIG. 1F, a threshold electric field known as the coercive field ($E_c$) must be applied in order to switch the polarization vectors from one direction to another. After removal of an applied field of greater than $E_c$, residual strain and/or uncompensated internal depolarization fields results in some back-switching which reduces the overall polarization to some value of remanent polarization ($P_r$) less than the spontaneous polarization of an individual unit cell ($P_s$). The symmetry of this process produces a hysteresis loop of the shape shown in the figure. While the value of $P_s$ is tied to the crystallography of a material, $E_c$ in particular and $P_r$ to a smaller extent can be influenced by extrinsic factors.

Ferroelectric materials that have been proposed for use as an opening switch take advantage of the nonlinearity in permittivity K during switching from one polarization state to another (e.g., from $-P_r$ to $+P_s$ under a positive electric field). $P_s$ and $P_r$ are important parameters for such operation because they relate directly to the amount of charge transferred during switching. See G. H. Rim et al., "Fast High Voltage Pulse Generation Using Nonlinear Capacitors," IEEE International Pulsed Conference, 1460-1463 (1999); G. H. Rim et al., "Nanosecond Pulse Generation with Nonlinear Capacitors and Magnetic Power Compression," IEEE International Pulsed Power Conference (2002); and K. Reed et al., "Ferroelectric Opening Switches for Large-Scale Pulsed Power Drivers," SAND2009-7527 (2009). Even more important for efficient and effective FEOS operation is the ratio in effective permittivity between the dynamic switching state ($K_{switch}$) and the fully-saturated state ($K_{sat}$, at large-magnitude E values). Since the permittivity at any point is directly proportional to the local slope on the hysteresis loop and $E_c$ is defined as the point at which the hysteresis loop crosses the P=0 axis, $K_{switch}$ can be approximated as K at $E_c$. The coercive field is also important because the larger the field required to reverse polarization, the less efficient the opening switch.

The main advantages of FEOS technology lie in the increased current density and transfer efficiency compared to semiconductor switches, greater potential repetition rates and lifetimes compared to plasma and related switches, and better impedance match to inductive loads than achievable with closing switches. See K. Reed et al., "Ferroelectric Opening Switches for Large-Scale Pulsed Power Drivers," SAND2009-7527 (2009). All of these advantages depend upon being able to control—or at least predictably reproduce—a high-rate dynamic polarization reversal process. Absent extrinsic factors, however, the nucleation that initiates polarization reversal is a classic stochastic process.

The present invention relies on nucleation to achieve the rapid polarization reversal of interest for FEOS applications and, in particular, recognizes surface texture or ceramic grain boundaries as effective nucleation sites for polarization reversal or uses optical photons to nucleate switching in a ferroelectric crystal. In the description below, single crystal lithium tantalate ($LiTaO_3$) is used as an exemplary ferroelectric material to demonstrate the effect of nucleation on macroscopic polarization switching times via both experiment and simulation using a phase field model. Importantly, $LiTaO_3$ in single crystal form has only two possible polarization directions, and therefore exhibits only 180° (non-ferroelastic) domain walls. However, other ferroelectric materials, such as barium titanate ($BaTiO_3$), lithium niobate ($LiNbO_3$), lead zirconate titanate ($Pb(Zr,Ti)O_3$), or other varieties of these piezoelectric materials, can also be used with the invention.

Figure 2A:
FIG. 2A illustrates a pristine $LiTaO_3$ single crystal wafer.
Figure 2B:
FIGS. 2B and 2C illustrate the introduction of mechanical indents to serve as electric field-enhancing nucleation sites.
Figure 2C:
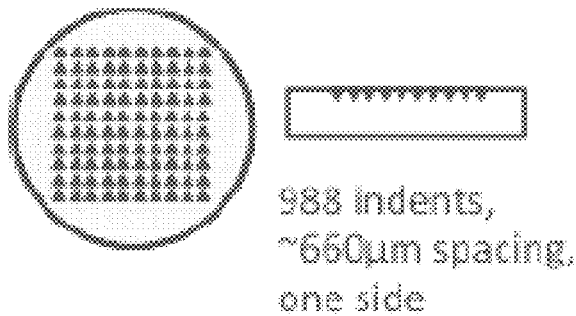
Figures 3A, 3B:
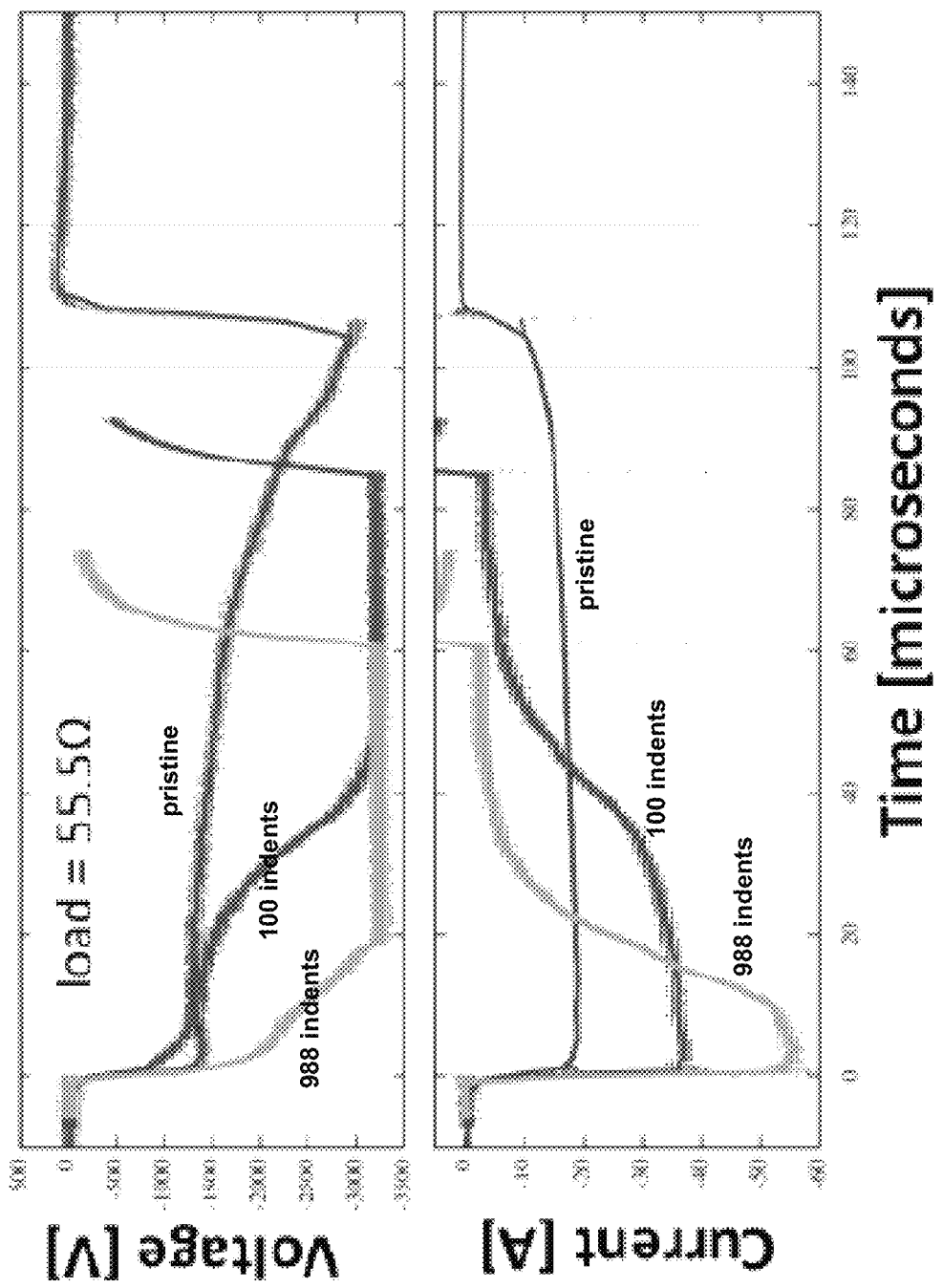
FIGS. 3A and 3B are graphs of the switching characteristics of pristine and indented wafers.

Starting with three pristine wafers of $LiTaO_3$ exhibiting no optically-visible defects or blemishes on the surface or within the bulk, as shown in FIG. 2A, discrete nucleation sites were mechanically introduced using a nanoindentor on two of the wafers, as shown in FIGS. 2B and 2C, before sputtering identical Pt electrodes on both sides of all wafers. Testing the switching characteristics of these samples in a 55.5Ω load using an identical pulse discharge setup revealed significantly faster macroscopic polarization switching (and corresponding larger switching currents) for the surface-textured samples with discrete nucleation sites, as shown in FIGS. 3A and 3B. See F. J. Zutavern et al., "A Testbed for High Voltage, High Bandwidth Characterization of Nonlinear Dielectrics," Proc. 19$^{th}$ IEEE Pulsed Power Conference (2013). Presumably, the mechanical indents result in a buildup of dislocations, ion displacement, etc. which contribute to the nucleation and pinning properties of the ferroelectric. Further, the indents also provide a change in surface topology, resulting in an increased local electric field under an applied bias. Therefore, increasing the number and spatial uniformity of the nucleation sites presumably increases the switching uniformity and rate.

Figure 4A:
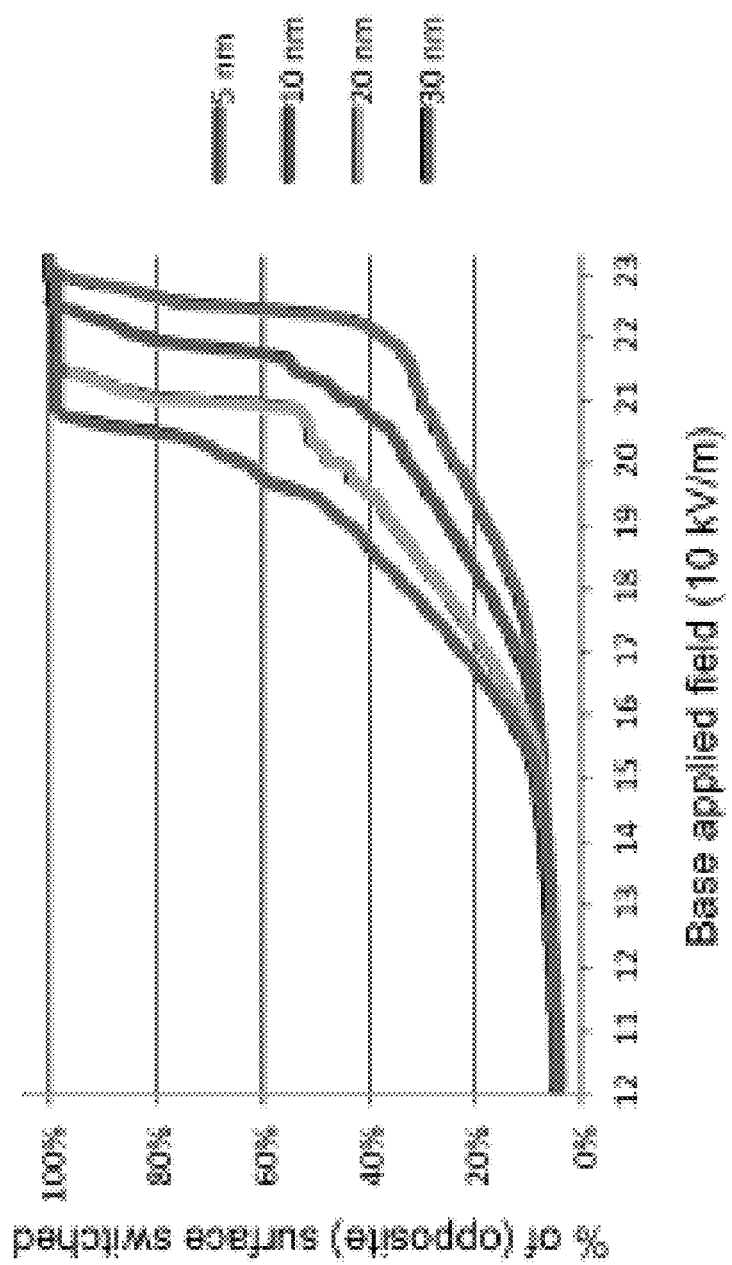
FIG. 4A is a graph showing the speed of switching for various indent widths under a constant voltage ramp for a $LiTaO_3$ single crystal.
Figure 4B:
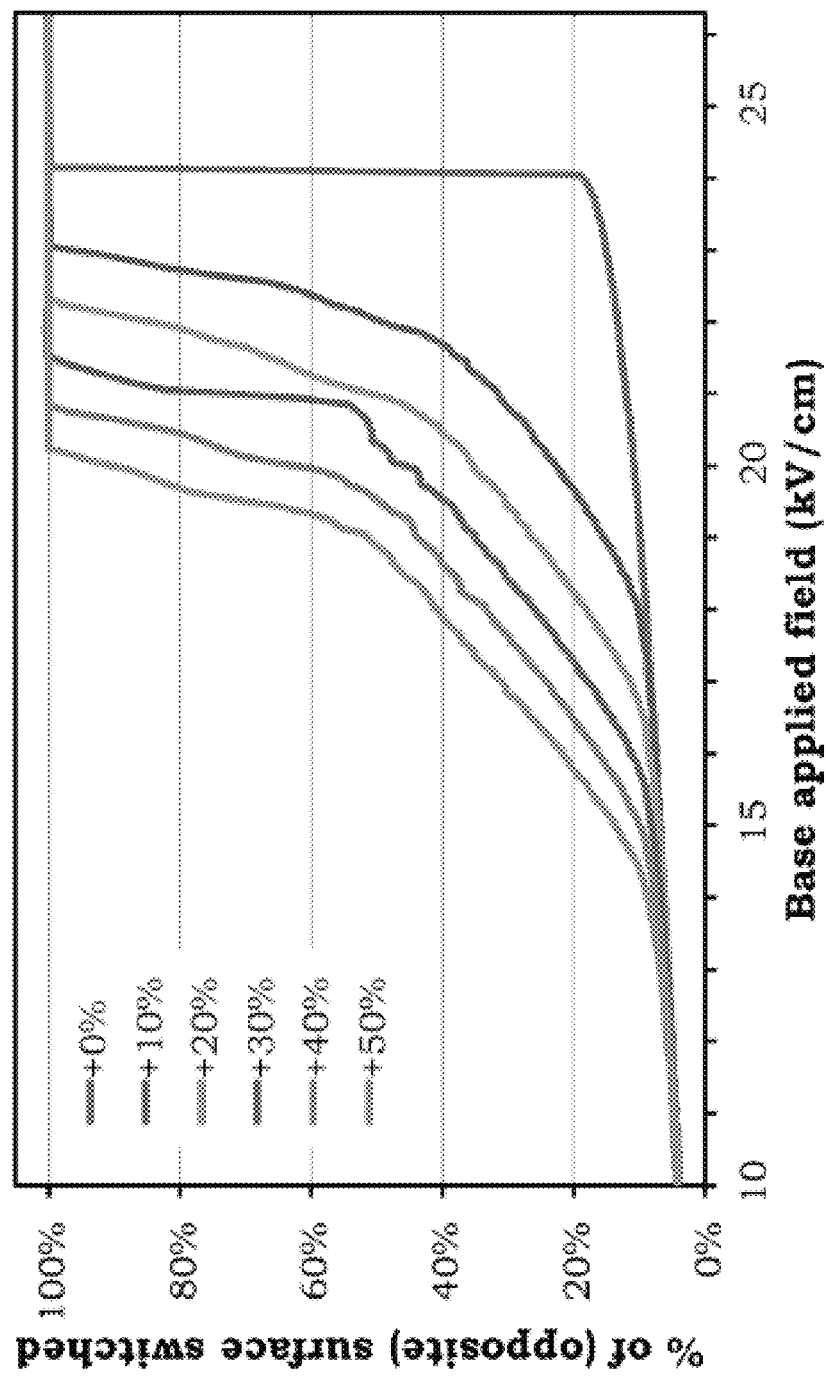
FIG. 4B is a graph showing the speed of switching for varying magnitudes of extra potential applied at the indent under a constant voltage ramp.

These results were supported by phase field modeling of an analogous situation in which field-enhancing electrode protrusions were introduced onto the surface of a $LiTaO_3$ single crystal slab. FIG. 4A shows the effect of changing the indent width for a given peak overpotential of 30% in the simulation. Here, the base applied field refers to the uniform bias due to the applied field and overpotential refers to the increased local field resulting from the indent. The wider indents nucleate faster than the narrower indents, and with proportionally more initial surface area, they also grow faster for a given applied field. FIG. 4B shows the effect of changing the overpotential magnitude while using a constant indent width of 10 nm. A greater overpotential increase results in nucleation at a lower applied field. However, the switching occurs at about the same rate, regardless of the overpotential. As expected, zero overpotential results in abrupt, homogeneous switching at the coercive field. These phase field simulations show both that the applied field can be reduced significantly from the coercive field with the amount of field enhancement provided by the nucleation sites and that the time required to fully switch polarization states can be similarly reduced as the physical size of the indents increases. Combined, these results demonstrate that polarization reversal in single crystals is nucleation limited.

Earlier work by the inventors showed that polycrystalline ferroelectrics based on $BaTiO_3$ or $Pb(Zr,Ti)O_3$ can also function as ferroelectric opening switches. See K. Reed et al., "Ferroelectric Opening Switches for Large-Scale Pulsed Power Drivers," SAND2009-7527 (2009). Polycrystalline samples included a high density of native nucleation sites, presumably grain boundaries. To make a direct comparison of switching times of samples of nominally identical chemistry, polarization reversal characteristics were compared for commercial $BaTiO_3$ single crystals as well as in-house-fabricated polycrystalline $BaTiO_3$ ceramics. Further, to eliminate sample texture as an uncontrolled variable (the single crystals were fully (001) oriented and the standard polycrystalline ceramic samples were randomly-oriented), polycrystalline $BaTiO_3$ samples were fabricated with a high degree of bulk texture via a template grain growth (TGG) process. See G. L. Brennecka et al., "Grain Size and Texture Effects on Polarization Reversal Dynamics in $BaTiO_3$ under High Power Drive Conditions," presented at $23^{rd}$ Int. Sym. on Applications of Ferroelectrics, May 12-16, 2014; and W. Meier et al., "Highly Textured $BaTiO_3$ via Templated Grain Growth and Resulting Polarization Reversal Dynamics," J. Am. Ceram. Soc. 99(3), 922 (2016).

Figure 5:
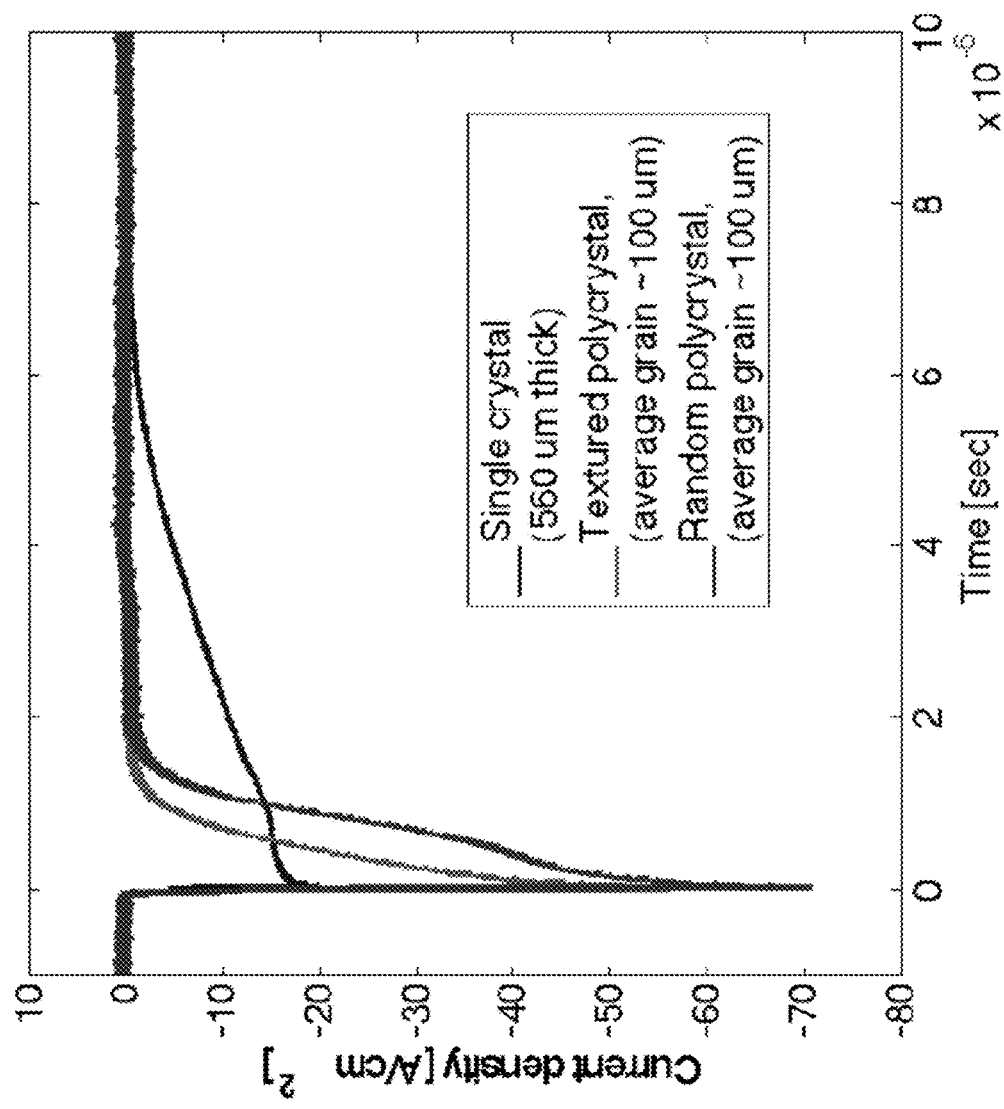
FIG. 5 is a graph showing the time evolution of switching current density for three representative samples of nominally-identical composition showing the importance of grain size on polarization reversal dynamics.

Comparing the switching characteristics of the $BaTiO_3$ samples, as shown in FIG. 5, it is clear that the polarization reversal behavior of the textured TGG sample is more similar to the randomly-oriented polycrystalline material than to the nucleation-limited single crystal. The switching time for the single crystal is significantly longer than for the polycrystalline samples. Domain wall pinning defects presumably cause the difference in switching current magnitude between the TGG and random samples. These results confirm nucleation as a limiting factor in the switching of single crystal ferroelectrics, demonstrate that crystallographic orientation—while critical to switchable polarization magnitude-plays at most a secondary role in determining switching dynamics, and strongly suggest that grain boundaries throughout the bulk of polycrystalline samples serve as effective nucleation sites for polarization reversal. Thus, domain walls which nucleate at a grain boundary need only travel a maximum distance equivalent to the grain size—here, about 100 µm—whereas surface nucleated domain walls in single crystal samples must traverse the entire thickness of the sample (here about 560 µm) and travel laterally an unknown distance determined by the stochastic nucleation density from a nominally pristine surface. Therefore, the switching time for a single crystal is significantly longer than for polycrystalline samples having grain boundaries that serve as effective nucleation sites. Note that the typical grain size in many ceramics is on the order of 1-5 µm, which should exhibit even faster switching than that shown in FIG. 5. Therefore, in designing a material for use as a ferroelectric opening switch, while the ultimate velocity of an individual domain wall is limited by the acoustic velocity of a given material, grain size is a variable that can be used to control nucleation density and thus affect macroscopic polarization reversal dynamics.

Use of single crystal ferroelectrics such as $LiTaO_3$ for FEOS applications is attractive for a number of reasons described elsewhere, but as demonstrated above, the dynamic response of such materials is nucleation limited. See K. Reed et al., "Ferroelectric Opening Switches for Large-Scale Pulsed Power Drivers," SAND2009-7527 (2009). Macroscopic polarization reversal times, however, can be shortened by increasing nucleation density. In polycrystalline samples, a large nucleation density results from the presence of a large number of grain boundaries within the bulk of the body. One possible approach to initiating bulk nucleation within a single crystal that lacks such grain boundaries is to create free charges (i.e., electron-hole pairs) optically within the bulk of the material. This approach enables precise control of nucleation density and therefore switching dynamics in an already fabricated material that can be used as an opening switch. Grain boundary density in a material is set during initial fabrication and processing and cannot be changed during operation; however, the used of optically initiated nucleation sites provides external control of nucleation density that can be adjusted during operation without having to replace the ferroelectric material with one of a different grain size. Additionally, since the optically-induced nucleation is not associated with structural defects, it does not result in performance-degrading domain wall pinning as seen in the TGG samples shown in FIG. 5.

Figure 6:
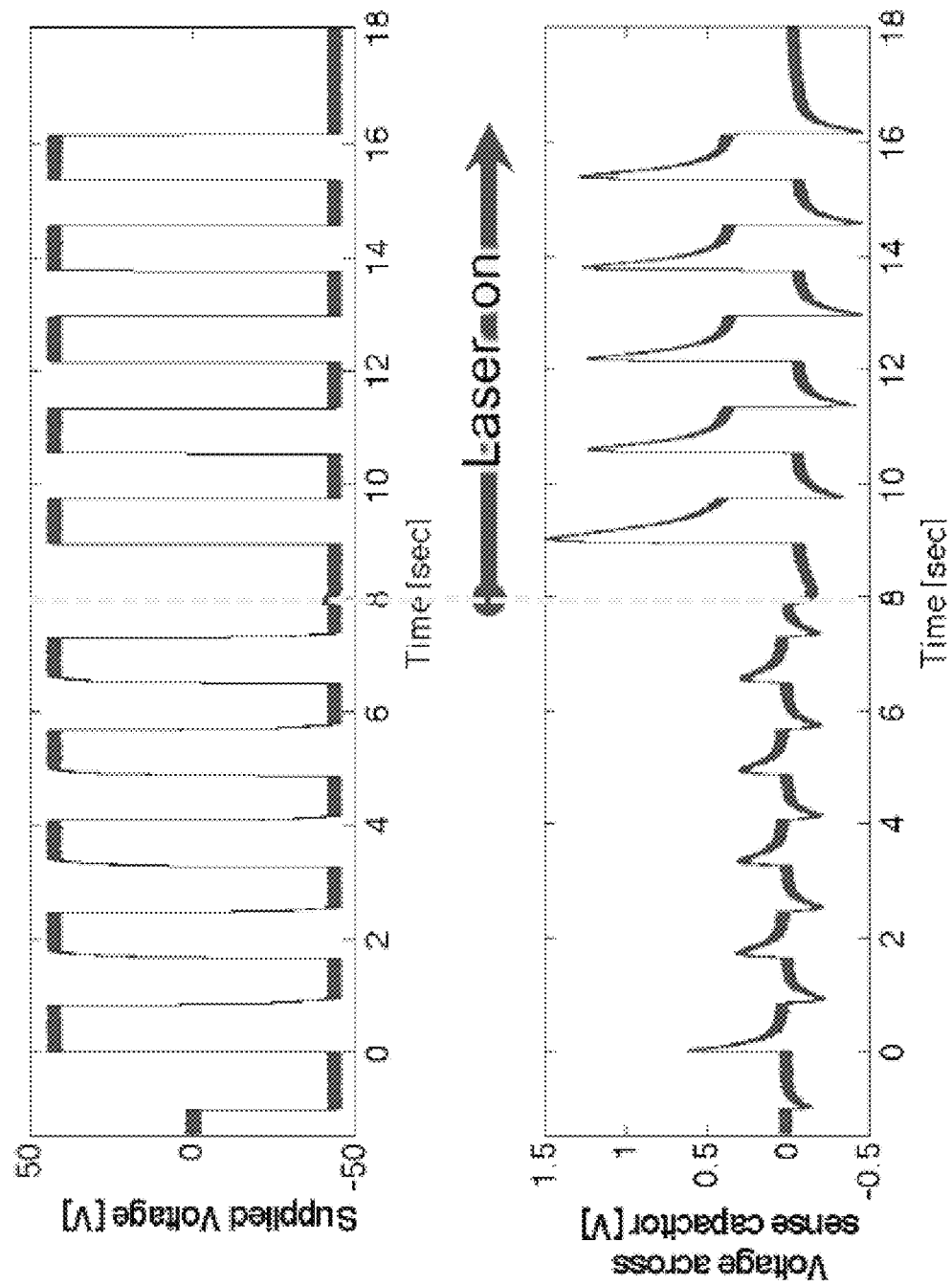
FIG. 6 is a graph of representative data from a series of experiments demonstrating the ferroelectric switching-initiating effect of incident 390 nm laser light on the polarization reversal behavior of single crystal $LiTaO_3$.

A setup was constructed to demonstrate proof of optical nucleation of ferroelectric switching in single crystal $LiTaO_3$. The sample was coated with indium-tin-oxide (ITO) electrodes to enable a voltage to be applied to the crystal. With the setup, just above band gap light was used blanket illuminate a surface to effectively trigger polarization reversal at voltages below $E_c$. Representative results are shown in FIG. 6. Applying a bipolar waveform just below the experimentally determined coercive field for this sample, a small amount of current flows upon polarity reversal, representative of the saturated capacitance of the ferroelectric. Upon illumination with a laser beam of an energy light should be weakly absorbed by the sample (390 nm), the magnitude of the current increases dramatically, a strong indication of light-induced polarization reversal. Similar experiments with high powers of non-absorbed light (780 nm) showed no change in electrical response, and the magnitude of dc leakage current was not affected in any measurable manner by the presence or absence of the 390 nm light, indicating that the measured change in electrical response was a result of nucleated polarization reversal rather than simple photoconduction. Alternatively, light having energies greater than the band gap can also be used, for example using a flash lamp. In this case, the nucleation would be limited to the near-surface region of the material, so it is essentially the optical equivalent to the mechanical seeding approaches demonstrated in FIGS. 2, 3, and 4.

A birefringence laser pattern can be used to pattern a domain structure within an optically transparent ferroelectric. Therefore, an embodiment of the invention involves establishing an interference pattern within the bulk of a ferroelectric material (either a single crystal or a sintered polycrystalline ceramic) using a laser of energy below the band gap of the ferroelectric in order to minimize absorption except at the foci where constructive interference of two split beams leads to high optical powers and two-photon absorption.

The present invention has been described as a ferroelectric opening switch. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A ferroelectric opening switch, comprising:
    a ferroelectric material comprising at least one crystal having a permanent electric dipole determined by the crystallographic symmetry of the ferroelectric material and a having plurality of nucleation sites; and
    a voltage source for applying an electric field to the ferroelectric material;
    wherein polarization reversal of the electric dipoles is nucleated at the nucleation sites when the electric field is applied, thereby changing current flow in the switch.

2. The ferroelectric opening switch of claim 1, wherein the ferroelectric material comprises $BaTiO_3$, $Pb(Zr,Ti)O_3$, $LiNbO_3$, or $LiTaO_3$.

3. The ferroelectric opening switch of claim 1, wherein the applied electric field is below the coercive field of the ferroelectric material.

4. The ferroelectric opening switch of claim 1, wherein the ferroelectric material comprises a single crystal.

5. The ferroelectric opening switch of claim 4, wherein the plurality of nucleation sites comprise a surface texture.

6. The ferroelectric opening switch of claim 5, wherein the surface texture comprises indents.

7. The ferroelectric opening switch of claim 1, wherein the ferroelectric material comprises a polycrystalline ceramic.

8. The ferroelectric opening switch of claim 7, wherein the plurality of nucleation sites comprise grain boundaries.

9. The ferroelectric opening switch, further comprising a light source for illuminating the ferroelectric material, wherein absorbed photons create free charges optically within the ferroelectric material, thereby nucleating the polarization reversal.

10. The ferroelectric opening switch of claim 9, wherein the light source has energy below the band gap of the ferroelectric material.

11. The ferroelectric opening switch of claim 10, wherein the light source comprises a laser and wherein the laser establishes an interference pattern, thereby providing the plurality of nucleation sites within the ferroelectric material.

12. The ferroelectric opening switch of claim 9, wherein the light source has energy above the band gap of the ferroelectric material.

13. The ferroelectric opening switch of claim 12, wherein the light source comprises a laser or flash lamp and wherein the plurality of nucleation sites are limited to the near-surface region of the ferroelectric material.

\* \* \* \* \*